United States Patent
Jung

(10) Patent No.: US 10,078,178 B2
(45) Date of Patent: Sep. 18, 2018

(54) FLEXIBLE PRINTED CIRCUIT BOARD, BACK LIGHT UNIT AND LIQUID CRYSTAL DISPLAY DEVICE USING THE SAME

(71) Applicant: LG DISPLAY CO., LTD., Seoul (KR)

(72) Inventor: Yeoun Jei Jung, Daegu (KR)

(73) Assignee: LG DISPLAY CO., LTD., Seoul (KR)

( * ) Notice: Subject to any disclaimer, the term of this patent is extended or adjusted under 35 U.S.C. 154(b) by 36 days.

(21) Appl. No.: 14/743,620

(22) Filed: Jun. 18, 2015

(65) Prior Publication Data
US 2016/0187558 A1 Jun. 30, 2016

(30) Foreign Application Priority Data
Dec. 29, 2014 (KR) .................. 10-2014-0192207

(51) Int. Cl.
*F21V 8/00* (2006.01)
*H05K 1/11* (2006.01)
*F21V 21/14* (2006.01)
*H05K 1/18* (2006.01)

(52) U.S. Cl.
CPC .............. *G02B 6/009* (2013.01); *F21V 21/14* (2013.01); *H05K 1/115* (2013.01); *H05K 1/118* (2013.01); *H05K 1/113* (2013.01); *H05K 1/189* (2013.01); *H05K 2201/053* (2013.01); *H05K 2201/10106* (2013.01); *H05K 2201/10136* (2013.01)

(58) Field of Classification Search
CPC .................................................. G02B 6/009
See application file for complete search history.

(56) References Cited

U.S. PATENT DOCUMENTS

| | | | |
|---|---|---|---|
| 2002/0109805 A1* | 8/2002 | Baba ................ | G02F 1/133615 349/65 |
| 2007/0015378 A1* | 1/2007 | Huang ................ | H05K 1/118 439/67 |
| 2010/0326704 A1 | 12/2010 | Huang et al. | |
| 2013/0141667 A1* | 6/2013 | Son .................... | G02B 6/0083 349/62 |
| 2013/0186680 A1 | 7/2013 | Ha et al. | |
| 2014/0094222 A1* | 4/2014 | Lee .................... | G06F 13/4068 455/558 |
| 2014/0111743 A1* | 4/2014 | Takemura .............. | F21S 2/00 349/64 |
| 2014/0226080 A1* | 8/2014 | Tomomasa .......... | G02B 6/0085 348/794 |
| 2014/0374148 A1 | 12/2014 | Su et al. | |

FOREIGN PATENT DOCUMENTS

JP 2011244006 A 12/2011

* cited by examiner

*Primary Examiner* — Edmond Lau
(74) *Attorney, Agent, or Firm* — Dentons US LLP

(57) ABSTRACT

Disclosed is a liquid crystal display device (LCD) that may include a flexible printed circuit board of which electrodes arranged at one side and the other side are connected to each other through a contact hole, and a back light unit that uses a guide panel of which a lateral side end is opened.

22 Claims, 7 Drawing Sheets

(a)

(b)

(c)

FLEXIBLE PRINTED CIRCUIT BOARD, BACK LIGHT UNIT AND LIQUID CRYSTAL DISPLAY DEVICE USING THE SAME

This application claims the benefit of the Korean Patent Application No. 10-2014-0192207 filed on Dec. 29, 2014, which is hereby incorporated by reference for all purposes as if fully set forth herein.

BACKGROUND OF THE INVENTION

Field of the Invention

The present invention relates to a liquid crystal display device (LCD) and method of manufacturing the same, and more particularly, to a flexible printed circuit board, a back light unit and an LCD using the same.

Discussion of the Related Art

Flat panel displays (FPD) have been used for various kinds of electronic products including cellular phones, tablet PCs, and notebook computers. Examples of flat panel displays include liquid crystal display devices (LCDs), plasma display panels (PDPs), and organic light emitting display devices (OLEDs). Recently, electrophoretic displays (EPDs) have been widely used as a flat panel display.

LCDs have been commercially used most widely owing to their advantages such as mass production techniques, matured driving techniques, and high picture quality.

FIG. 1A is an exemplary view illustrating a cross-section of an LCD according to the related art. FIG. 1B is an exemplary view illustrating a bottom of an LCD according to the related art. Particularly, FIG. 1B illustrates a bottom of the LCD from direction 'Z' of FIG. 1A.

Referring to FIG. 1A, the LCD according to the related art includes a reflecting plate 11, a light guide panel 12, an optical film module 13, a guide panel 14, a liquid crystal panel 16, a light-shielding tape 15, and a light source module 20.

The light source module 20 includes a flexible printed circuit board (FPCB) 21 and a light source 22. The flexible printed circuit board 21 is attached to the guide panel 14, the light source 22 and the light guide panel 12 by an adhesive tape 17. The guide panel 14 may be supported by a cover bottom 18.

To complete the LCD, the liquid crystal panel 16 is attached to the light source module 20, the light guide panel 12 and the optical film module 13 by the light-shielding tape 15.

Recently, studies have been in progress to reduce a width of an outer portion (hereinafter, simply referred to as 'bezel') of the LCD.

As shown in FIGS. 1A and 1B, because the guide panel 14 is provided in a rectangular frame type, and because the light source module 20 is arranged at a bezel area NAA of the guide panel 14, it may have been difficult to reduce the width of the bezel NAA of the LCD according to the related art.

For example, the bezel area NAA of the LCD according to the related art includes a first area A extending from an outer portion of a display area A/A, from which an image is output, to an outer portion of the light guide panel 12, a second area B extending from the first area A to the guide panel 14, and a third area C corresponding to a thickness of the guide panel 14 and the cover bottom 18.

Since each of the above areas performs its unique function, it may be difficult to remove any one of the areas randomly, or it may be difficult to reduce a width of any one of the areas randomly. As a result, it may have been difficult to reduce the width of the bezel area NAA where the light source module 20 is arranged.

SUMMARY OF THE INVENTION

Accordingly, the present invention is directed to a flexible printed circuit board, a back light unit and a liquid crystal display device (LCD) using the same that substantially obviate one or more of the problems due to limitations and disadvantages of the related art.

An advantage of the present invention is to provide an LCD with reduced bezel width.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described, a flexible printed circuit board may, for example, include a first electrode arranged on a first side of a substrate; a second electrode arranged on the first side of the substrate and connected to the first electrode; a first side electrode arranged on a second side of the substrate and connected to the first electrode through a first contact hole formed in the substrate, wherein the second side is opposite to the first side; and a second side electrode arranged on the second side of the substrate and connected to the second electrode through a second contact hole formed in the substrate.

The first side of the substrate may be a top side of the substrate, and the second side of the substrate may be a bottom side of the substrate.

In one or more embodiments, the substrate comprises a main portion having a first lateral end and a second lateral end opposite the first lateral end, and a projecting portion projecting from the main portion near the second lateral end, wherein the first electrode and the second electrode are disposed on the main portion, and wherein the first side electrode and the second side electrode are disposed on the main portion and on the projecting portion.

In one or more embodiments, the projecting portion of the substrate may be referred to as an extension substrate of the flexible printed circuit board.

In one or more embodiments, the first electrode comprises a plurality of electrode patterns, a first electrode pattern of the electrode patterns is arranged at the first lateral end of the main portion and connected to the second electrode, a second electrode pattern of the electrode patterns is arranged at the second lateral end of the main portion, and is connected to the first side electrode through the first contact hole, and the second side electrode is connected to the second electrode through the second contact hole.

In one or more embodiments, the flexible printed circuit board further comprises a light source disposed between two adjacent electrode patterns of the plurality of electrode patterns.

In one or more embodiments, the flexible printed circuit board further comprises a plurality of light sources, each light source being disposed between two respective adjacent electrode patterns of the plurality of electrode patterns, and a light-shielding pad for shielding light attached between at least two light sources of the plurality of light sources.

In one or more embodiments, the substrate further comprises a connecting portion configured to be connected to an external terminal and connected to the projecting portion, wherein the first side electrode and the second side electrode extend from the main portion via the projecting portion up to an end of the connecting portion.

In one or more embodiments, the projecting portion together with the connecting portion may be referred to as an extension substrate of the flexible printed circuit board.

In one or more embodiments, the connecting portion comprises a third contact hole and a fourth contact hole, wherein the first side electrode is connected from the second side of the substrate to the first side of the substrate through the third contact hole, and wherein the second side electrode is connected from the second side of the substrate to the first side of the substrate through the fourth contact hole.

In one or more embodiments, first and second portions of the first side electrode corresponding to the main portion and to the projecting portion of the substrate, respectively, are disposed on the second side of the substrate, a third portion of the first side electrode corresponding to the connecting portion of the substrate is disposed on the first side of the substrate, and the second portion and the third portion of the first side electrode are electrically connected through the third contact hole, and first and second portions of the second side electrode corresponding to the main portion and to the projecting portion of the substrate, respectively, are disposed on the second side of the substrate, a third portion of the second side electrode corresponding to the connecting portion of the substrate is disposed on the first side of the substrate, and the second portion and third portion of the second side electrode are electrically connected through the fourth contact hole.

In one or more embodiments, the connecting portion is disposed at an angle with respect to the projecting portion.

In one or more embodiments, the angle is about 90 degrees.

In one or more embodiments, the projecting portion is disposed at an angle of about 90 degrees with respect to the main portion.

A back light unit in accordance with various embodiments comprises a guide panel of which a lateral side is opened; a light guide panel arranged in the guide panel; and a light source module arranged at the lateral side of the guide panel, and irradiating light toward a side of the light guide panel arranged at the lateral side of the guide panel, wherein the light source module comprises: at least one light source emitting light; and a flexible printed circuit board according to one or more embodiments described herein, on which the light source is placed, wherein the first and second electrodes of the flexible printed circuit board are connected to the light source.

A liquid crystal display (LCD) device in accordance with various embodiments comprises a liquid crystal panel; and a back light unit according to one or more embodiments described herein, supporting the liquid crystal panel and irradiating light toward the liquid crystal panel.

In another aspect of the present invention, a flexible printed circuit board comprises a substrate made of a flexible material; a first electrode arranged on one side of the substrate; a second electrode arranged on the one side of the substrate and connected to the first electrode; a first side electrode arranged on the other side of the substrate and connected to the first electrode through a first contact hole formed in the substrate; and a second side electrode arranged on the other side of the substrate and connected to the second electrode through a second contact hole formed in the substrate. The one side and the other side of the substrate may be opposite, e.g. top and bottom, sides of the substrate.

The flexible printed circuit board, or parts thereof, may be further configured in accordance with one or more embodiments described herein.

In another aspect of the present invention, a back light unit comprises a guide panel of which a lateral side is opened; a light guide panel arranged in the guide panel; and a light source module arranged at the lateral side of the guide panel, irradiating light toward a side of the light guide panel arranged at the lateral side of the guide panel. The back light unit, or parts thereof, may be further configured in accordance with one or more embodiments described herein.

In other aspect of the present invention, an LCD comprises a liquid crystal panel; and a back light unit supporting the liquid crystal panel and irradiating light toward the liquid crystal panel, wherein the back light unit includes a guide panel of which a lateral side is opened; and a light source module arranged at the lateral side of the guide panel, irradiating light, and the light source module is made of a flexible material, on which a light source irradiating light is placed, having one side on which first and second electrodes connected to the light source are arranged and the other side on which first and second side electrodes connected to the first and second electrodes are arranged. The one side and the other side may be opposite, e.g. top and bottom, sides of the flexible material. The LCD, or parts thereof, may be further configured in accordance with one or more embodiments.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE ILLUSTRATED EMBODIMENTS

Reference will now be made in detail to embodiments of the present invention, examples of which are illustrated in the accompanying drawings. The same reference numbers may be used throughout the drawings to refer to the same or like parts.

Figure 2:
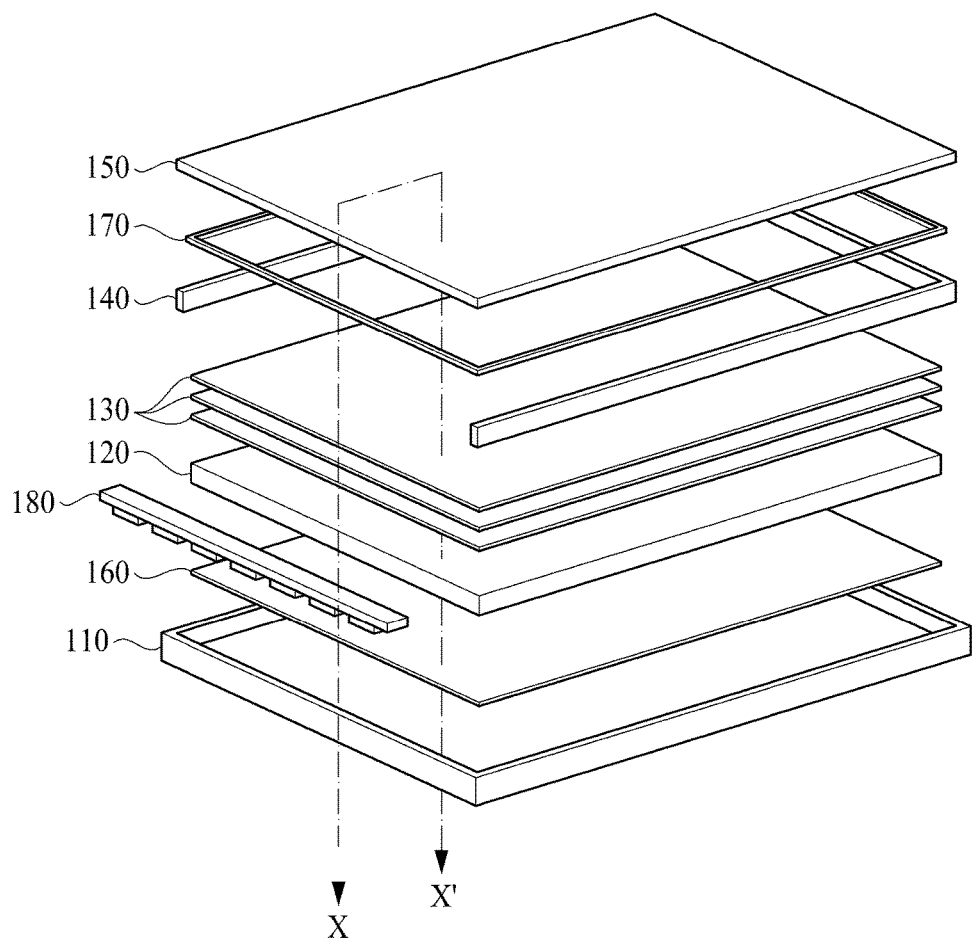
FIG. 2 is an exploded perspective view illustrating an LCD according to one embodiment of the present invention.
Figure 3:
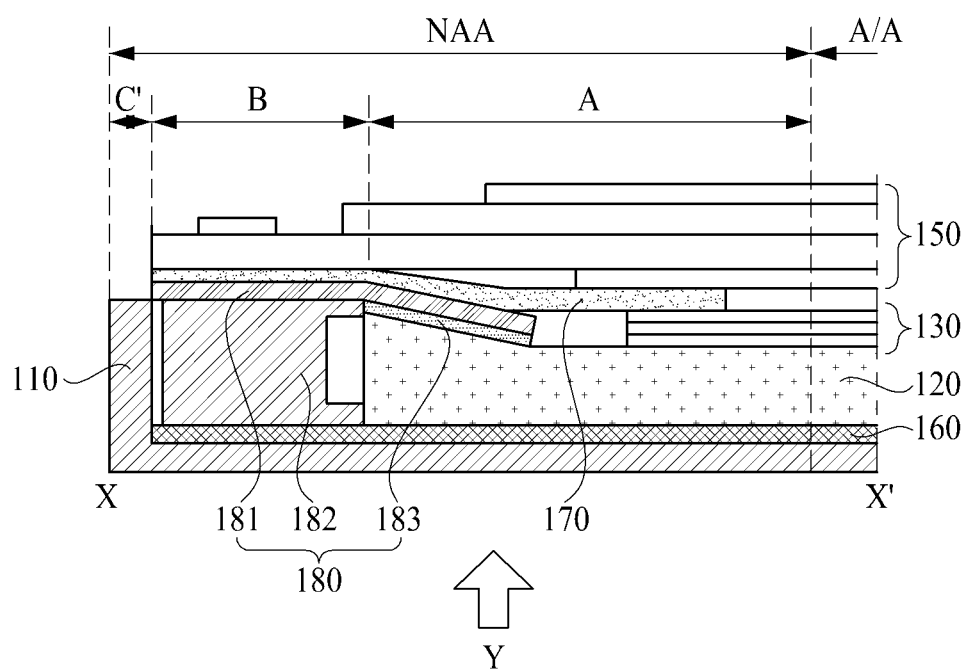
FIG. 3 is an exemplary view illustrating a cross-section of an LCD according to one embodiment of the present invention.

FIG. 2 is an exploded perspective view illustrating a liquid crystal display device (LCD) according to one embodiment of the present invention. FIG. 3 is an exemplary view illustrating a cross-section of an LCD according to one embodiment of the present invention, especially illustrating a cross-sectional view taken along line X-X' of FIG. 2.

Referring to FIGS. 2 and 3, the LCD includes a liquid crystal panel 150, and a back light unit supporting the liquid crystal panel 150 and irradiating light to the liquid crystal panel 150. The back light unit includes a guide panel 140 of which one lateral side (or end) is opened, and a light source module 180 arranged at the lateral side (or end) of the guide panel 140 to irradiate light to the liquid crystal panel 150.

The liquid crystal panel 150 includes liquid crystal between an array substrate and a color filter substrate, and outputs images by controlling the transmittance of the light emitted from the light source module 180.

A polarizing film may be attached to an upper end surface (also referred to as top surface) and a lower end surface (also referred to as bottom surface) of the liquid crystal panel 150. The polarizing film is attached to at least one of the upper end surface and the lower end surface of the liquid crystal panel 150, and serves to pass through only the light having a specific directional component from the light transferred through a light guide panel 120.

The back light unit further includes a light-shielding tape 170 attached to the lower end surface of the liquid crystal panel 150, the light source module 180, the guide panel 140, an optical film module 130 comprised of a plurality of optical sheets, a light guide panel 120 directing the light output from the light source module 180 toward the liquid crystal panel 150, a reflecting plate 160 arranged on the bottom of the light guide panel 120, and a cover bottom 110 (also referred to as bottom cover) supporting the guide panel 140.

The light-shielding tape 170 has a shape of a rectangular frame as illustrated in FIG. 2, and is attached to a lower end surface of an outer portion (hereinafter, simply referred to as 'bezel') of the liquid crystal panel 150 and an upper end surface of the guide panel 140. The light-shielding tape 170 may be formed in various shapes depending on a shape of the liquid crystal panel 150.

The light-shielding tape 170 is to reduce or prevent the light transmitted from the light source module 180 from leaking between the guide panel 140 and the liquid crystal panel 150 and through the bezel.

The guide panel 140 has a shape of a rectangular frame so that the bezel of the liquid crystal panel 150 is arranged.

Particularly, as illustrated in FIG. 2, the guide panel 140 lacks one lateral side (or end), and the light source module 180 is arranged at the lateral side (or end) of the guide panel 140. If the guide panel 140 is formed in a shape of a rectangular frame, the guide panel 140 is substantially formed in a shape of '⊓' ("rectangular horseshoe" shape). In other words, one link of the rectangular frame may be missing. However, the guide panel 140 may be formed in various shapes depending on a shape of the liquid crystal panel 150. In this case, the lateral side (or end) of the guide panel 140 is opened.

The light-shielding tape 170 is attached to the upper end surface of the guide panel 140.

The guide panel 140 serves to guide the light source module 180. The light source module 180 is guided by the guide panel 140 and serves to direct the light toward a side of the light guide panel 140.

The light source module 180 includes a flexible printed circuit board (FPCB) 181 and at least two or more light sources 182.

The FPCB 181 is attached to an outer portion of the upper end surface of the light guide panel 120 and the upper end surface of the light sources 182 by an adhesive tape 183. Various types of lamps may be used as the light sources 182, such as light emitting diodes (LEDs).

The optical film module 130 includes a plurality of optical sheets. The optical film module 130 serves to diffuse the light that has passed through the light guide panel 120 or allow the light that has passed through the light guide panel 12 to vertically enter the liquid crystal panel 150. To this end, the optical film module 130 may include a diffuser sheet that diffuses the light and a prism sheet that direct the light vertically to the liquid crystal panel 150.

The light guide panel 120 directs the light output from the light source module 180 toward the liquid crystal panel 150. The light guide panel 120 may be formed of a transparent material in a shape of a panel. The light guide panel 120 serves to direct the light emitted from the light source module 180 toward the liquid crystal panel 150 arranged on the upper end of the light guide panel 120 by scattering and reflecting the light. The light guide panel 120 may be formed of plastic or resin, such as PMMA (Polymethylmethacrylate).

The reflecting plate 160 is arranged on the bottom of the light guide panel 120. The reflecting plate 160 is arranged on the lower end surface of the light guide panel 120, and serves to reflect the light, which is emitted from the light source module 180 and travels toward the lower end of the light guide panel 120, toward the liquid crystal panel 150 arranged on the upper end of the light guide panel 120.

For example, the light, which is emitted from the light source module 180 and enters the light guide panel 120, is refracted by a pattern formed in the light guide panel 120 and reflected toward the liquid crystal panel 150. However, some light may leak out through the lower end surface of the light guide panel 120 without being reflected toward the liquid crystal panel 150. The reflecting plate 160 serves to reflect the light, which may leak out through the lower end surface of the light guide panel 120, toward the light guide panel 120 and guide the light toward the liquid crystal panel 150.

The cover bottom 110 supports the guide panel 140. The cover bottom 110 serves to receive the aforementioned elements as well as the guide panel 140. In this case, the cover bottom 110 may be secured to a case top, which covers the bezel of the liquid crystal panel 150, to receive the aforementioned elements. However, the cover bottom 110 may receive the aforementioned elements independently without the case top. The cover bottom 110 may be omitted in some cases.

Figure 4:
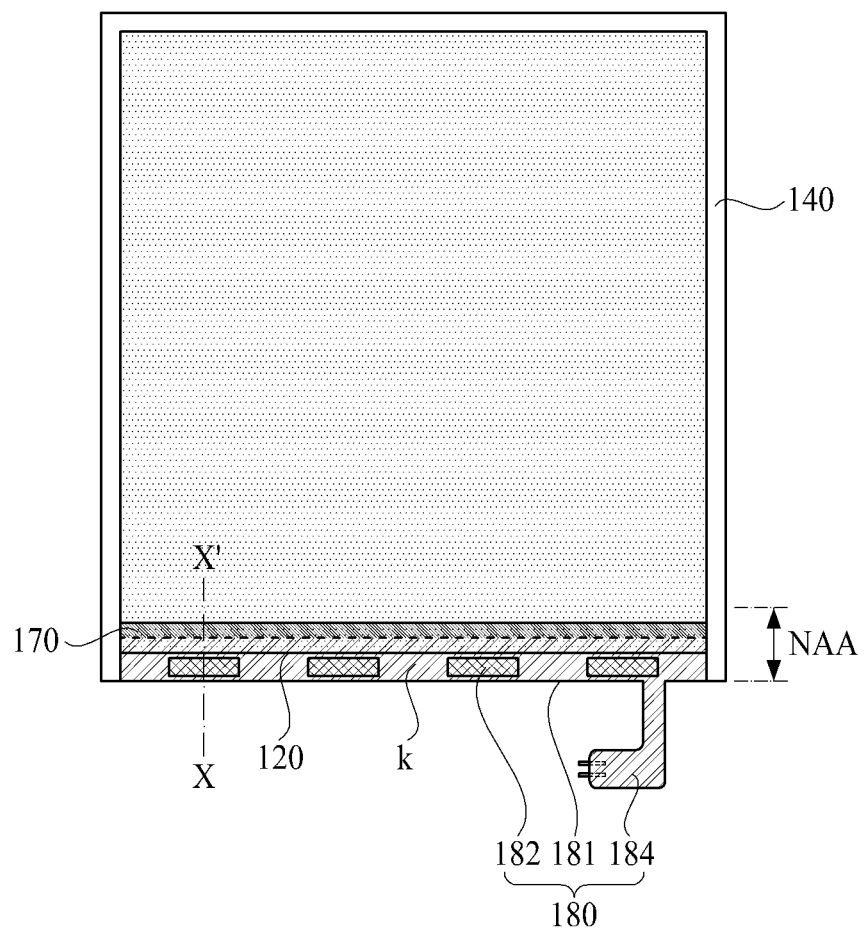
FIG. 4 is an exemplary view illustrating a bottom of an LCD according to one embodiment of the present invention.

FIG. 4 is an exemplary view illustrating a bottom of an LCD according to one embodiment of the present invention, especially illustrating a bottom of the LCD from direction 'Y' of FIG. 3, wherein the reflecting plate 160 and the cover bottom 110, which are arranged on the lower end surface of the light guide panel 120, are omitted for simplicity.

As illustrated in FIGS. 2 to 4, the guide panel 140 according to one embodiment of the present invention lacks one lateral side (or end). The light source module 180 is arranged at the opened lateral side (or end) of the guide panel 140.

Since the lateral side (or end) of the guide panel 140 is opened, a bezel area NAA of the LCD (in other words, an area of the bezel where the light source module 180 is arranged) includes a first area A extending from an outer portion of a display area A/A, from which an image is output, to an outer portion of the light guide panel 120, a second area B extending from the first area A to the cover bottom 110, and a third area C' corresponding to a thickness of the cover bottom 110.

Figure 1A:
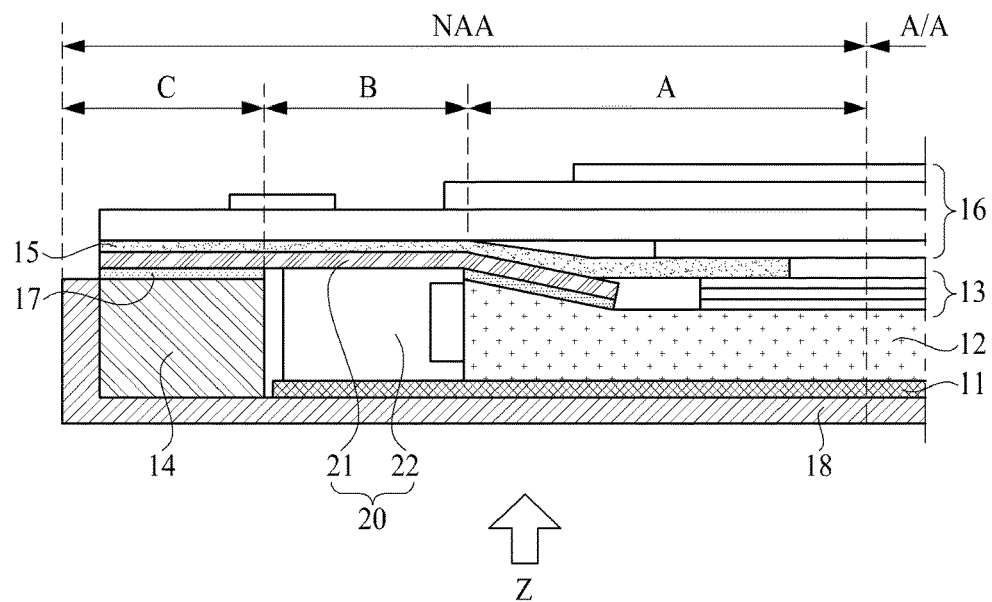
FIG. 1A is an exemplary view illustrating a cross-section of a liquid crystal display device (LCD) according to the related art.
Figure 1B:
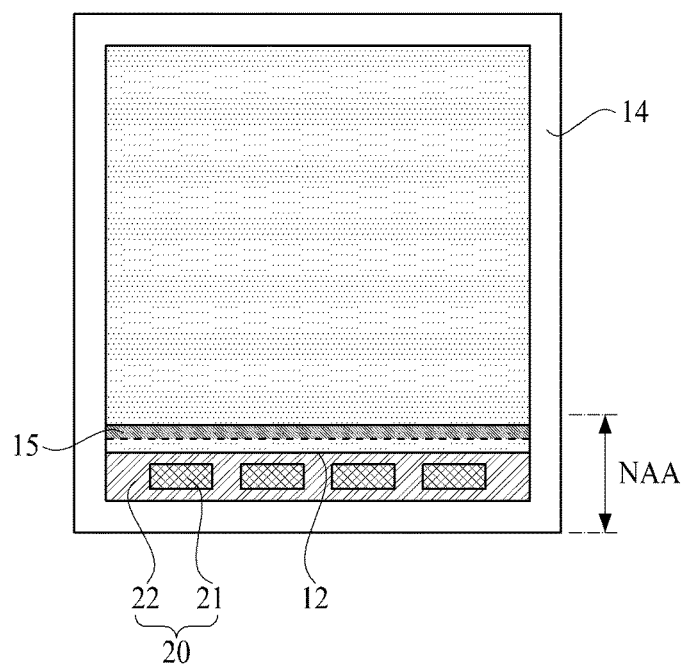
FIG. 1B is an exemplary view illustrating a bottom of an LCD according to the related art.

The first area A and the second area B of the bezel area NAA of the LCD according to one embodiment of the present invention are almost the same as those of the LCD shown in FIG. 1 according to the related art.

However, because the lower end of the guide panel 140 is opened, a width of the third area C' of the bezel area NAA of the LCD according to one embodiment of the present invention is reduced in comparison with the third area C of the LCD according to the related art.

In more detail, the width of the third area C of the LCD according to the related art includes a width of the guide panel 140 and a width of the cover bottom 110. However, the width of the third area C' of the LCD according to one embodiment of the present invention includes a width of the cover bottom 110, but not a width of the guide panel 140. As a result, the third area C' can be reduced, leading to reduction in the width of the bezel area NAA.

Figure 5:
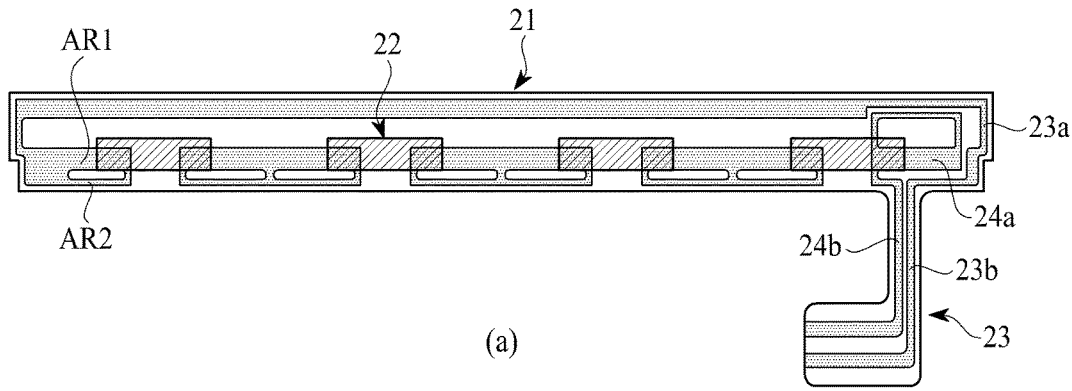
FIG. 5 illustrates comparison between light source modules to which flexible printed circuit boards are applied according to embodiments of the present invention and a light source module to which a flexible printed circuit board of the related art is applied.
Figure 5:
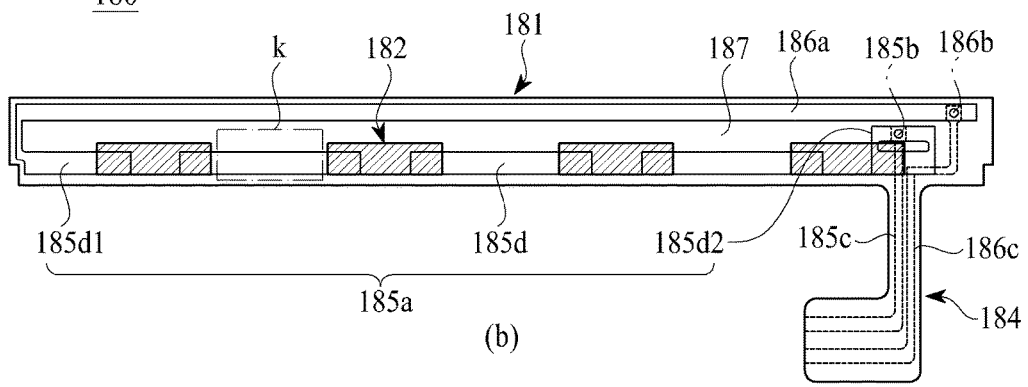
Figure 5:
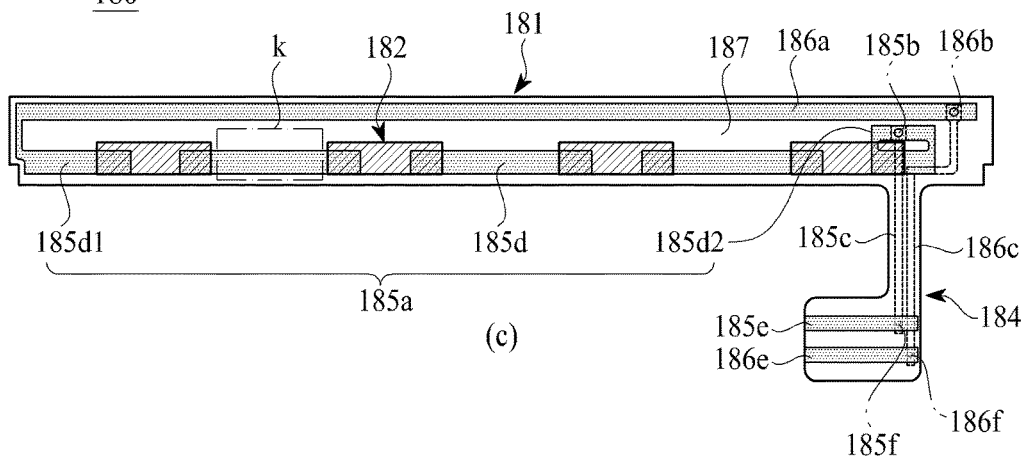

FIG. 5 illustrates comparison between light source modules to which FPCBs are applied according to embodiments of the present invention and a light source module to which a FPCB of the related art is applied. In FIG. 5, (a) illustrates a plane of the light source module 20 to which the FPCB 21 of the related art is applied, (b) illustrates a plane of a light source module 180 to which a FPCB 181 is applied according to an embodiment of the present invention, and (c) illustrates a plane of a light source module 180 to which a FPCB 181 is applied according to another embodiment of the present invention. The light source module 180 to which the flexible printed circuit board 181 is applied as illustrated in (b) or (c) of FIG. 5 may be applied to the LCD illustrated in FIGS. 2 to 4.

Figure 6:
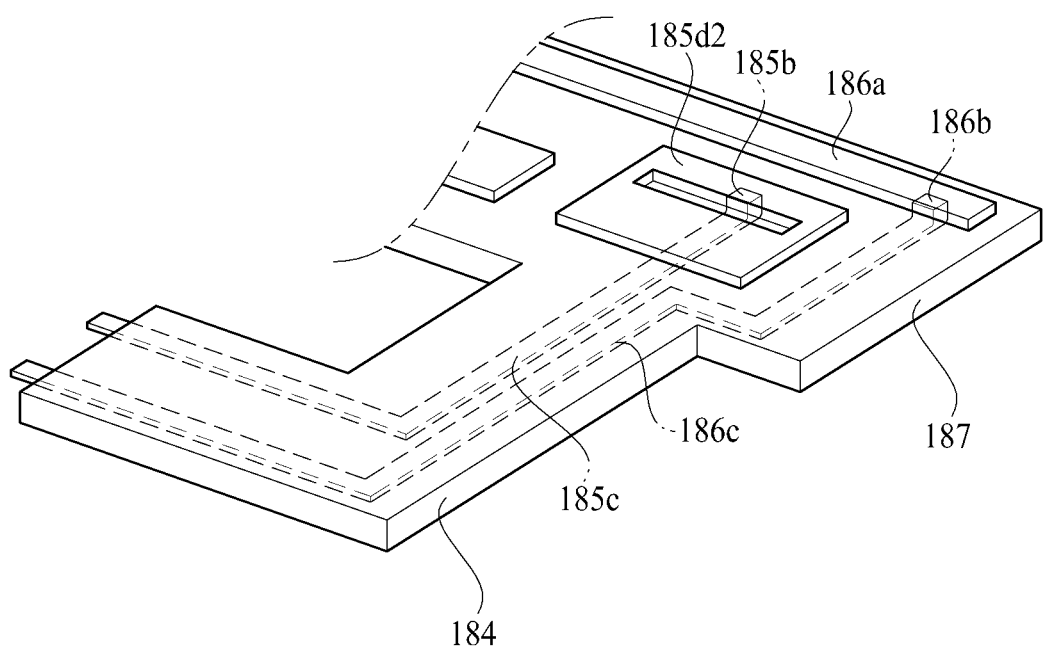
FIG. 6 is an exemplary view illustrating a portion where an extension substrate of a flexible printed circuit board according to embodiments of the present invention projects from a main portion of a substrate of the flexible printed circuit board.
Figure 7:
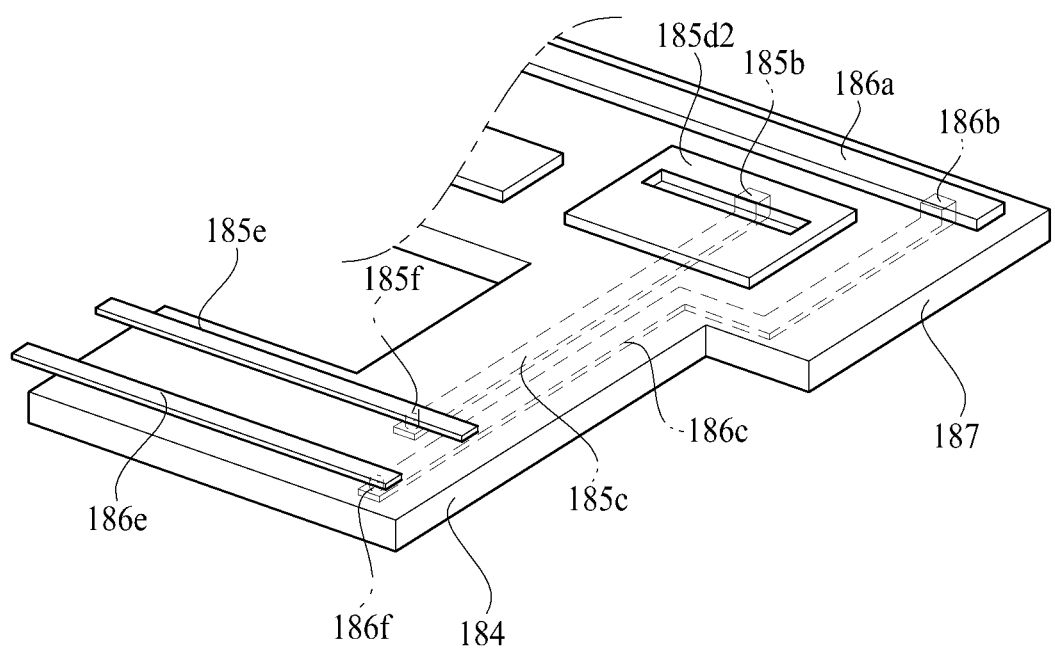
FIG. 7 is another exemplary view illustrating a portion where an extension substrate of a flexible printed circuit board according to embodiments of the present invention projects from a main portion of a substrate of the flexible printed circuit board.

FIG. 6 is an exemplary view illustrating a portion where an extension substrate of a FPCB according to one embodiment of the present invention projects from a main portion of a substrate of the FPCB, and FIG. 7 is another exemplary view illustrating a portion where an extension substrate of a FPCB according to another embodiment of the present invention projects from a main portion of a substrate of the FPCB. The views illustrated in FIG. 6 and FIG. 7 may correspond to the embodiments illustrated in (b) and (c) of FIG. 5, respectively.

Referring to (b) of FIG. 5, the light source module 180 to which the FPCB 181 is applied according to one embodiment of the present invention includes at least one or more light sources 182 emitting light, and the FPCB 181 made of, for example, a flexible material, on which the light sources 182 are placed, wherein first and second electrodes 185a and 186a connected to the light sources 182 are arranged on one side (e.g., top side) of the FPCB 181 and first and second side electrodes 185c and 186c connected to the first and second electrodes 185a and 186a are arranged on the other side (e.g., bottom side) of the FPCB 181.

In this case, the FPCB 181 according to one embodiment of the present invention includes a substrate 187 made of a flexible material, the first electrode 185a arranged on one side (e.g., top side) of the substrate 187 (also referred to as first side of the substrate), the second electrode 186a arranged on the one side of the substrate 187 and connected to the first electrode 185a, the first side electrode 185c arranged on the other side (e.g., bottom side) of the substrate 187 (also referred to as second side of the substrate) and connected to the first electrode 185a through a first contact hole 185b formed in the substrate 187, and the second side electrode 186c arranged on the other side of the substrate 187 and connected to the second electrode 186a through a second contact hole 186b formed in the substrate 187.

As illustrated in (b) of FIG. 5, the substrate 187 may include a main portion having a first lateral end and a second lateral end opposite the first lateral end, and a projecting portion projecting from the main portion near the second lateral end.

The main portion of the substrate 187 may refer to the elongated portion of the substrate 187 extending from the left side to the right side, and the first lateral end may refer to a left end, and the second lateral end may refer to a right end of the elongated portion. The projecting portion may be disposed at an angle of about 90 degrees with respect to the main portion. The first electrode 185a and the second electrode 186a may be disposed on the main portion. The first side electrode 185c and the second side electrode 186c may be disposed on the main portion and on the projecting portion. In other words, a first portion of the first side electrode 185c may be disposed on the main portion of the substrate 187 and a second portion of the first side electrode 185c may be disposed on the projecting portion of the substrate 187. Similarly, a first portion of the second side electrode 186c may be disposed on the main portion of the substrate 187, and a second portion of the second side electrode 186c may be disposed on the projecting portion of the substrate 187.

As further illustrated in (b) of FIG. 5, the substrate 187 may further include a connecting portion (also referred to as connection portion) configured to be connected to an external terminal. The connecting portion (connection portion) may be connected to the projecting portion. The connecting portion may extend from the projecting portion. The first side electrode 185c and the second side electrode 186c may extend from the main portion of the substrate 187 via the projecting portion up to an end of the connecting portion. For example, a third portion of the first side electrode 185c and a third portion of the second side electrode 186c may be disposed on the connecting portion. The first side electrode 185c and second side electrode 186c may be disposed on only one side (e.g., the second side or bottom side) of the substrate 187. For example, the first, second and third portions of the first side electrode 185c and the first, second and third portions of the second side electrode 186c may all be disposed on the same side of the substrate 187 (e.g., the second side or bottom side). The connecting portion may be disposed at an angle of, for example, about 90 degrees with respect to the projecting portion. The projecting portion together with the connecting portion may also be referred to as an extension substrate 184 of the FPCB 181. The extension substrate 184 may project from the main portion of the substrate 187.

Each of the first and second electrodes 185a and 186a may be formed of a material having excellent conductivity, such as copper.

The first electrode 185a includes a plurality of electrode patterns 185d, wherein a first one 185d1 of the electrode patterns 185d, which is arranged at the first lateral end of the main portion of the substrate 187, is connected to the second electrode 186a, and a second one 185d2 of the electrode patterns 185d, which is arranged at the second lateral end of the main portion of the substrate 187, is connected to the first side electrode 185c through the first contact hole 185b.

For example, the substrate 187 on which the five electrode patterns 185d are arranged is illustrated in (b) of FIG. 5.

The first one 185d1 of the electrode patterns 185d, which is arranged at the left end of the main portion of the substrate 187 in (b) of FIG. 5, is connected to the second electrode 186a. The second one 185d2 of the electrode patterns 185d, which is arranged at the right end of the main portion of the substrate 187 in (b) of FIG. 5, is connected to the first side electrode 185c. In this case, the first side electrode 185c is connected to the second electrode pattern 185d2 through the first contact hole 185b formed in the substrate 187. Also, the first electrode 185a includes the electrode patterns 185d, and the first side electrode 185c are arranged on different surfaces of the substrate 187. Particularly, in (b) of FIG. 5 and FIG. 6, the first electrode 185a is arranged on the first side (e.g., upper end surface or top side) of the substrate 187, while the first side electrode 185c is arranged on the second side (e.g., lower end surface or bottom side) of the substrate 187.

Also, the second side electrode 186c is connected to the second electrode 186a through the second contact hole 186b at an area corresponding to an area of the second electrode 186a in which the second electrode pattern 185d2 is arranged. In this case, the second electrode 186a and the second side electrode 186c are arranged on different surfaces of the substrate 187. Particularly, in (b) of FIG. 5 and FIG. 6, the second electrode 186a is arranged on the first side (e.g., upper end surface or top side) of the substrate 187, while the second side electrode 186c is arranged on the second side (e.g., lower end surface or bottom side) of the substrate 187.

One light source 182 is in each case electrically connected to two of the electrode patterns 185d, which are adjacent to each other. Since the electrode patterns 185d are electrically connected to each other, if the light source 182 is electrically connected to the two electrode patterns 185d adjacent to each other, the two electrode patterns 185d serve as + electrode and − electrode, respectively.

A light-shielding pad (not shown) for shielding light may be attached to a light-shielding area k between the at least two or more light sources 182 arranged between the electrode patterns 185d, at one side of the substrate 187. The light-shielding pad may be formed of a synthetic resin that shields light, and then may be attached to the light-shielding area k by a separate adhesive tape. Alternatively, the light-shielding pad may be formed of an adhesive tape, which shields light, and may directly be attached to the light-shielding area k. The light-shielding pad may be made of various types of materials having, for example, a black color or various types of materials that can shield light.

As illustrated in FIG. 6, the extension substrate 184 projects from the main portion of the substrate 187 at an area of the main portion of the substrate 187, in which the first side electrode 185c and the second side electrode 186c are arranged. In this case, the extension substrate 184 is formed in a single body with the main portion of the substrate 187.

The extension substrate 184 may include the projecting portion and the connecting portion of the substrate 187. The extension substrate 184 may have an angled shape, for example, an "L" shape.

Also, the first side electrode 185c and the second side electrode 186c extend from the main portion of the substrate 187 to the extension substrate 184, for example, up to an end of the connecting portion of the substrate 187. The first and second side electrodes 185c, 186c may be disposed on a side of the substrate 187 that is opposite to the side of the substrate 187, on which the first and second electrodes 185a, 186a are disposed. For example, as illustrated in FIG. 6, if the first electrode 185a and the second electrode 186a are arranged on the first side (e.g., upper end surface or top side) of the substrate 187, the first side electrode 185c and the second side electrode 186c are arranged on the second side (e.g., lower end surface or bottom side) of the substrate 187. That is, the first and second side electrodes 185c, 186c may be disposed on the second side (e.g., lower end surface or bottom side) of the main portion of the substrate 187 and the second side (e.g., lower end surface or bottom side) of the extension substrate 184 (including the projecting portion and connecting portion of the substrate 187).

In some embodiments, a portion of the first and second side electrodes 185c, 186c may be disposed on another side of the substrate 187 than remaining portions of the first and second side electrodes 185c, 186c. For example, as illustrated in (c) of FIG. 5 and the corresponding view of FIG. 7, a portion 185e of the first side electrode 185c (e.g., a third portion of the first side electrode 185c disposed on the connecting portion of the substrate 187) and a portion 186e of the second side electrode 186c (e.g., a third portion of the second side electrode 186c disposed on the connecting portion of the substrate 187) may be disposed on the first side (e.g., upper end surface or top side) of the substrate 187 (e.g., on the first side of the connecting portion of the substrate 187), while remaining portions of the first and second side electrodes 185c, 186c (e.g., first and second portions of the first side electrode 185c disposed on the main portion and on the projecting portion of the substrate 187, respectively, and first and second portions of the second side electrode 186c disposed on the main portion and on the projecting portion of the substrate 187, respectively) may be disposed on the second side (e.g., lower end surface or bottom side) of the substrate 187.

As illustrated in (c) of FIG. 5 and FIG. 7, the connecting portion of the substrate 187 may include a third contact hole 185f and a fourth contact hole 186f, wherein the first side electrode 185c may be connected from the second side of the substrate 187 to the first side of the substrate 187 through the third contact hole 185f, and wherein the second side electrode 186c may be connected from the second side of the substrate 187 to the first side of the substrate 187 through the fourth contact hole 186f.

As described above, the width of the bezel area of the LCD according to one embodiment of the present invention can be reduced. In order to reduce the size of the bezel area NAA of the LCD, a portion of the guide panel 140, which is arranged in the bezel area NAA, can be removed. For example, the guide panel 140 may be formed in a shape of '⊓' ("rectangular horseshoe" shape). That is, the guide panel 140 may have a rectangular frame type shape where one of the four links of the frame is missing.

The width of the FPCB 181 on which the light source 182 is placed can be reduced in comparison with that of the related art. As a result, the width of the bezel area NAA may further be reduced. For example, as illustrated in (a) of FIG.

5, the FPCB according to the related art has a first area AR1 of the upper end surface of the FPCB 21, on which the light source is arranged, and a second area AR2 formed on the lower end of the first area AR1 and provided with copper foil patterns. In this case, the second area AR2 serves to address an electrical noise due to interaction between the light source 22 and the copper foil patterns. As a result, it may be difficult to remove the copper foil patterns provided in the second area AR2 randomly.

Also, if the second area AR2 is removed randomly, it may be difficult for the first electrode 24a and the second electrode 23a to be electrically connected with the first side electrode 24b and the second side electrode 23b. For example, in the FPCB 21 of the related art shown in (a) of FIG. 5, the first electrode 24a and the second electrode 23a corresponding to the first electrode 185a and the second electrode 186a according to one embodiment of the present invention and the first side electrode 24b and the second side electrode 23b corresponding to the first side electrode 185c and the second side electrode 186c according to one embodiment of the present invention are all arranged on one side of the FPCB 21.

Also, the above electrodes are extended to the same surface as the one side of the FPCB 21 on the extension substrate 23 extended from the FPCB 21. In other words, the first and second electrodes 24a, 23a and the first and second side electrodes 24b, 23b may all be arranged on the same side (e.g., upper end surface). As a result, in the FPCB 21 of the related art illustrated in (a) of FIG. 5, if the area corresponding to the second area AR2 is removed, the first side electrode 24b and the second side electrode 23b may not be arranged in the FPCB 21.

However, in the FPCB 181 according to one or more embodiments of the present invention, as illustrated in (b) and (c) of FIG. 5, the area corresponding to the second area AR2 is not provided with copper foil patterns, and the second area AR2 electrically connects the first electrode 185a and the second electrode 186a with the first side electrode 185c and the second side electrode 186c through the first contact hole 185b and the second contact hole 186b without being removed. As a result, the second area may be removed or its width may be reduced, whereby the width of the FPCB 181 may be reduced.

According to one embodiment of the present invention, the light-shielding pad may be attached to the area between the light sources 182 of the FPCB 181 to reduce or prevent the light emitted from the light source module 180 from leaking.

As described above, according to one embodiment of the present invention, because the guide panel lacks one lateral side (or end), and because the light source module is arranged at the lateral side (or end) of the guide panel, the width of the bezel area of the LCD may be reduced. As a result, the overall size of the bezel of the LCD may be reduced.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A flexible printed circuit board comprising:
   a first electrode arranged on a first side of a substrate;
   a second electrode arranged on the first side of the substrate and connected to the first electrode;
   a first side electrode arranged on a second side of the substrate and connected to the first electrode through a first contact hole formed in the substrate, wherein the second side is opposite to the first side; and
   a second side electrode arranged on the second side of the substrate and connected to the second electrode through a second contact hole formed in the substrate,
   wherein the first electrode overlaps both the first and second side electrodes, with the substrate therebetween.

2. The flexible printed circuit board of claim 1, wherein the substrate comprises a main portion having a first lateral end and a second lateral end opposite the first lateral end, and a projecting portion projecting from the main portion near the second lateral end,
   wherein the first electrode and the second electrode are disposed on the main portion, and
   wherein the first side electrode and the second side electrode are disposed on the main portion and the projecting portion.

3. The flexible printed circuit board of claim 2, wherein the first electrode comprises a plurality of electrode patterns,
   a first electrode pattern of the electrode patterns is arranged at the first lateral end of the main portion and connected to the second electrode,
   a second electrode pattern of the electrode patterns is arranged at the second lateral end of the main portion, and is connected to the first side electrode through the first contact hole, and
   the second side electrode is connected to the second electrode through the second contact hole.

4. The flexible printed circuit board of claim 3, further comprising a light source disposed between two adjacent electrode patterns of the plurality of electrode patterns.

5. The flexible printed circuit board of claim 3, further comprising a plurality of light sources, each light source being disposed between two respective adjacent electrode patterns of the plurality of electrode patterns, and a light-shielding pad for shielding light attached between at least two light sources of the plurality of light sources.

6. The flexible printed circuit board of claim 2, wherein the substrate further comprises a connecting portion configured to be connected to an external terminal and connected to the projecting portion, and
   wherein the first side electrode and the second side electrode extend from the main portion via the projecting portion up to an end of the connecting portion.

7. The flexible printed circuit board of claim 6, wherein the connecting portion comprises a third contact hole and a fourth contact hole,
   wherein the first side electrode is connected from the second side of the substrate to the first side of the substrate through the third contact hole, and
   wherein the second side electrode is connected from the second side of the substrate to the first side of the substrate through the fourth contact hole.

8. The flexible printed circuit board of claim 6, wherein first and second portions of the first side electrode corresponding to the main portion and to the projecting portion of the substrate, respectively, are disposed on the second side of the substrate, a third portion of the first side electrode corresponding to the connecting portion of the substrate is disposed on the first side of the substrate, and the second portion and the third portion of the first side electrode are electrically connected through the third contact hole; and
   wherein first and second portions of the second side electrode corresponding to the main portion and to the projecting portion of the substrate, respectively, are disposed on the second side of the substrate, a third portion of the second side electrode corresponding to the connecting portion of the substrate is disposed on the first side of the substrate, and the second portion and the third portion of the second side electrode are electrically connected through the fourth contact hole.

9. The flexible printed circuit board of claim 6, wherein the connecting portion is disposed at an angle with respect to the projecting portion.

10. The flexible printed circuit board of claim 9, wherein the angle is about 90 degrees.

11. The flexible printed circuit board of claim 2, wherein the projecting portion is disposed at an angle of about 90 degrees with respect to the main portion.

12. A backlight unit comprising:
a guide panel having a shape of a rectangular with three lateral frames and one lateral side being opened;
a light guide panel arranged in the guide panel; and
a light source module including a plurality of light sources and a flexible printed circuit board which is disposed on the light guide panel and overlapped with a portion of the light guide panel, the light source module arranged at the one lateral side of the guide panel,
wherein a light emitted from the plurality of light sources is directed toward the light guide panel through the opened lateral side of the guide panel,
the flexible printed circuit board includes a first electrode and a second electrode disposed on a first side of a substrate and a first side electrode disposed on a second side of the substrate, the second side opposite to the first side,
the second electrode is connected to the first electrode and the first side electrode is connected to the first electrode through a first contact hole formed in the substrate,
the flexible printed circuit board further includes a second side electrode disposed on the second side of the substrate and connected to the second electrode through a second contact hole formed in the substrate, and
the first electrode overlaps both the first and second side electrodes, with the substrate therebetween.

13. A liquid crystal display device comprising a liquid crystal panel and the backlight unit according to claim 12, wherein the backlight unit supports the liquid crystal panel and irradiates light toward the liquid crystal panel.

14. The liquid crystal display device according to claim 13, wherein the first and second electrodes are connected to the light sources.

15. The liquid crystal display device according to claim 14, wherein the substrate comprises a main portion having a first lateral end and a second lateral end opposite the first lateral end, and a projecting portion projecting from the main portion near the second lateral end,
wherein the first electrode and the second electrode are disposed on the main portion, and
wherein the first side electrode and the second side electrode are disposed on the main portion and the projecting portion.

16. The liquid crystal display device according to claim 15, wherein the first electrode comprises a plurality of electrode patterns,
a first electrode pattern of the electrode patterns is arranged at the first lateral end of the main portion and connected to the second electrode,
a second electrode pattern of the electrode patterns is arranged at the second lateral end of the main portion, and is connected to the first side electrode through the first contact hole, and
the second side electrode is connected to the second electrode through the second contact hole.

17. The liquid crystal display device according to claim 15, wherein the substrate further comprises a connecting portion configured to be connected to an external terminal and connected to the projecting portion, and
wherein the first side electrode and the second side electrode extend from the main portion via the projecting portion up to an end of the connecting portion.

18. The liquid crystal display device according to claim 15, wherein the connecting portion comprises a third contact hole and a fourth contact hole,
wherein the first side electrode is connected from the second side of the substrate to the first side of the substrate through the third contact hole, and
wherein the second side electrode is connected from the second side of the substrate to the first side of the substrate through the fourth contact hole.

19. The liquid crystal display device according to claim 15, wherein first and second portions of the first side electrode corresponding to the main portion and to the projecting portion of the substrate, respectively, are disposed on the second side of the substrate, a third portion of the first side electrode corresponding to the connecting portion of the substrate is disposed on the first side of the substrate, and the second portion and the third portion of the first side electrode are electrically connected through the third contact hole; and
wherein first and second portions of the second side electrode corresponding to the main portion and to the projecting portion of the substrate, respectively, are disposed on the second side of the substrate, a third portion of the second side electrode corresponding to the connecting portion of the substrate is disposed on the first side of the substrate, and the second portion and the third portion of the second side electrode are electrically connected through the fourth contact hole.

20. The backlight unit according to claim 12, wherein the light source module further includes an adhesive tape disposed between the light guide panel and the flexible printed circuit board.

21. The backlight unit according to claim 20, wherein the flexible printed circuit board is attached to the light guide panel with the adhesive tape.

22. The backlight unit according to claim 12, wherein the light guide panel has a first portion and a second portion closer to the plurality of light sources, and
wherein the thickness of the second portion is greater than that of the first portion.

* * * * *